(12) United States Patent
Odaki et al.

(10) Patent No.: US 7,691,293 B2
(45) Date of Patent: Apr. 6, 2010

(54) RED LIGHT-EMITTING PHOSPHOR AND LIGHT-EMITTING DEVICE

(75) Inventors: Tsutomu Odaki, Nishishirakawa-gun (JP); Tsutomu Takano, Nishishirakawa-gun (JP)

(73) Assignee: Kabushiki Kaisha Fine Rubber Kenkyuusho, Nishishirakawa-gun (JP)

( * ) Notice: Subject to any disclaimer, the term of this patent is extended or adjusted under 35 U.S.C. 154(b) by 400 days.

(21) Appl. No.: 11/514,131

(22) Filed: Sep. 1, 2006

(65) Prior Publication Data

US 2008/0001122 A1  Jan. 3, 2008

(30) Foreign Application Priority Data

Jun. 29, 2006  (JP) .............................. 2006-179806

(51) Int. Cl.
   *C09K 11/68* (2006.01)
   *C09K 11/54* (2006.01)
   *H01J 1/62* (2006.01)
   *H01J 63/04* (2006.01)

(52) U.S. Cl. .......................... 252/301.5; 252/301.4 R; 313/503; 313/498; 313/512

(58) Field of Classification Search .......... 252/301.4 R, 252/301.5; 313/503, 498, 499, 501, 502, 313/512
See application file for complete search history.

(56) References Cited

U.S. PATENT DOCUMENTS 6,319,425 B1   11/2001  Tasaki et al.
6,623,670 B2    9/2003  Tasaki et al.
6,878,436 B2 *  4/2005  Reilly et al. ................. 428/221
6,982,523 B2 *  1/2006  Odaki ......................... 313/503
7,126,265 B2 * 10/2006  Jermann et al. ............. 313/485

FOREIGN PATENT DOCUMENTS

JP    2004-359842    12/2004

OTHER PUBLICATIONS

Tsunemasa Taguchi, "LED display", Journal of Illuminating Engineering Institute of Japan, Institute of Illuminating Engineering, Japan, 2003, vol. 87, No. 1, pp. 42-47.

* cited by examiner

*Primary Examiner*—C. Melissa Koslow
*Assistant Examiner*—Matthew E Hoban
(74) *Attorney, Agent, or Firm*—Oblon, Spivak, McClelland, Maier & Neustadt, L.L.P.

(57) ABSTRACT

A red light-emitting phosphor capable of emitting red light upon excitation with light having a wavelength of 350 to 420 nm, represented by the following compositional formula (1):

$$A_{(1-x)}Eu_{(1-x-y)}Ln_yD_{2x}M_2O_8 \qquad (1)$$

wherein A is at least one element selected from the group consisting of Li, Na, K, Rb and Cs, Ln is at least one element selected from rare earth elements including Y but excluding Eu, D is at least one element selected from the group consisting of Mg, Ca, Sr and Ba, M is at least one element selected from Mo and W, x is a positive number satisfying $0 < x \leq 0.7$, and y is 0 or a positive number satisfying $0 < y \leq 0.5$, and x+y is a number satisfying $0 < x+y \leq 0.7$. When a red light-emitting phosphor in the form of particles having an average size of secondary particles of 40 to 200 μm is used in combination with a green light-emitting phosphor and a blue light-emitting phosphor, there can be obtained a light-emitting device which ensures precise reproduction of minute color shades and emits white or intermediate light of good color rendering properties at high luminance.

3 Claims, 4 Drawing Sheets

RED LIGHT-EMITTING PHOSPHOR AND LIGHT-EMITTING DEVICE

CROSS-REFERENCE TO RELATED APPLICATION

This non-provisional application claims priority under 35 U.S.C. §119(a) on Patent Application No. 2006-179806 filed in Japan on Jun. 29, 2006, the entire contents of which are hereby incorporated by reference.

BACKGROUND OF THE INVENTION

1. Field of the Invention

This invention relates to a red light-emitting phosphor capable of emitting red light at a high emission efficiency by excitation with light having a wavelength of 350 to 420 nm and also to a light-emitting device using the red light-emitting phosphor.

2. Background Art

A light-emitting diode (LED) is a semiconductor light-emitting device for light emission wherein an electric energy is converted to ultraviolet light, visible light, infrared light or the like. For instance, those making use of visible light include semiconductor light-emitters formed of light-emitting materials such as GaP, GaAsP, GaAlAs and the like, and LED lamps, in which these devices are sealed with transparent resins and the like, are now in wide use. In addition, LED lamps of a display type wherein a light-emitting material is fixed on an upper surface of a substrate or a metallic lead and is sealed with a transparent resin case shaped in the form of a numerical figure or letter has been used for various purposes.

Where a light-emitting diode that is a semiconductor device and is thus long in life and high in reliability is employed as a light source, replacement thereof is so easy that the diode has been widely used as a component part of various types of display devices such as portable communication devices, peripheral devices of personal computers, business machines, domestic electric appliances, audio devices, various types of switches, light sources of backlight, bulletin boards and the like.

Such a LED lamp may cover a wide variety of colors within a visible region of blue to red depending on the purpose in use by incorporating different types of phosphor powders in a transparent resin sealing a semiconductor light-emitter therein thereby ensuring color changes of light emitted from the LED lamp.

In recent years, however, there has been a great demand of users for color shades of such display devices. More particularly, not only a performance ensuring more precise reproducibility of minute color shades is required for display devices, but also there is a strong demand for a LED lamp which is able to emit a white color and different types of intermediate colors on its own.

To this end, attempts have been made to arrange LED lamps in such a way that different types of phosphors for red, green and blue are contained onto a surface of a semiconductor light-emitter of a LED lamp, or phosphors of such types as mentioned above are contained in a sealing material, coating material and the like of an LED lamp, thereby ensuring display of a white color and different types of intermediate colors only by a single LED lamp.

Among these phosphors, those phosphors that are excited with long wavelength UV light or short wavelength visible light (350 to 420 nm) and are currently in main use are ones including $BaMg_2Al_{16}O_{27}$:Eu, or $(Sr,Ca,Ba)_5(PO_4)_3Cl$:Eu whose emission color is blue, $BaMg_2Al_{16}O_{27}$:Eu, Mn, or $Zn_2GeO_4$:Mn whose emission color is green, $Y_2O_2S$:Eu, $La_2O_2S$:Eu, or $3.5MgO.0.5MgF_2.GeO_2$:Mn whose emission color is red, or the like. When these light-emitting phosphors are properly used, a wide range of light-emitting colors can be obtained.

However, the red light-emitting phosphor has a problem in that when compared with blue and green light-emitting phosphors, this phosphor is poorer in light emission against long wavelength UV light and short wavelength visible light (350 to 420 nm).

This involves problems in that where a white light-emitting color is obtained by use of light of these wavelengths, it is necessary to increase a ratio of the red light-emitting phosphor, thus inviting high costs and that white color is obtainable by balancing red, green and blue light emissions, so that in order to obtain a white light-emitting color, green and blue light emissions have to be reduced in conformity with a red light emission, and because an amount of a phosphor to be used has an upper limit, the resulting white light emission is reduced and thus, white light of a high luminance cannot be obtained. Hence, there is a demand for a red light-emitting phosphor that has a high emission efficiency and is able to emit light at high luminance.

In recent years, it has been reported that an InGaN device, which has attracted attention as a LED device capable of emitting light in long wavelength UV light and short wavelength visible light regions and ensuring high luminance light emission (Tsunemasa Taguchi, "LED display", Journal of Illuminating Engineering Institute of Japan, Institution of Illuminating Engineering, Japan, 2003, Vol. 87, No. 1, pp. 42-47), has a light-emitting wavelength of approximately 400 nm, especially about 400 to 410 nm, at which an external quantum efficiency indicates the highest value. Thus, a red light emitting phosphor that is capable of emitting red light of high intensity within such a wavelength range as indicated above has been demanded. However, a wavelength corresponding to an excitation energy of an electron pair of an oxide compound is within a UV range. The wavelength of long wavelength UV light and short wavelength visible light (350 to 420 nm) overlaps with an absorption end of the phosphor, under which an absorption intensity at a wavelength side longer than 350 nm of these red light-emitting phosphors lowers abruptly as the wavelength becomes longer and, in fact, lowers considerably within a range not lower than 400 nm. To cope with this, it is necessary to develop a red light-emitting phosphor whose light-emitting intensity is high at a wavelength of about 400 nm.

SUMMARY OF THE INVENTION

An object of the invention is to provide a red light-emitting phosphor which is suited for a light-emitting device for emitting white light by using, in combination, a red light-emitting phosphor, a green light-emitting phosphor and a blue light-emitting phosphor and which is able to emit light of high luminance at a high emission efficiency and yield good color rendering properties, and also to provide a light-emitting device for emitting white light at high luminance and good color rendering properties wherein the red light-emitting phosphor is used.

It is known that when irradiated with an energy corresponding to an energy level of a rare earth ion, the ion absorbs the energy. Since the 4f electron of a rare earth ion is shielded from the influence from outside by means of $5s^2$ and $5p^6$ electrons existing at the outside thereof, the energy level becomes an inherent level to the ion, not depending greatly on the environment. Where a rare earth ion undergoes light emission from a phosphor directly absorbing an excitation energy, and especially, where light emission 350 to 400 nm is obtained using near-UV light or purple to blue light as an excitation energy, an obstacle for obtaining high luminance light emission is due to the fact the an absorptivity of the excitation energy is not high.

We have found that a red light emitting phosphor represented by the following compositional formula (1)

$$A_{(1-x)}Eu_{(1-x-y)}Ln_yD_{2x}M_2O_8 \quad (1)$$

(wherein A is at least one element selected from the group consisting of Li, Na, K, Rb and Cs, Ln is at least one element selected from rare earth elements including Y but excluding Eu, D is at least one element selected from the group consisting of Mg, Ca, Sr and Ba, M is at least one element selected from Mo and W, x is a positive number satisfying 0<x≦0.7, y is 0 or a positive number satisfying 0<y≦0.5, and x+y is a number satisfying 0<x+y≦0.7), contains an Eu ion and this Eu ion directly absorbs light having a wavelength of 350 to 420 nm emitted from a semiconductor light-emitter and emits red light at a high emission efficiency and that when this red light-emitting phosphor is employed for a light-emitting device for emitting white light by use of a red light-emitting phosphor, a green light-emitting phosphor and a blue light-emitting phosphor in combination, such a light-emitting device is able to emit white light with good color rendering properties.

With an oxide phosphor of a metal or a rare earth element hitherto obtained as a fired product, the phosphor can be more efficiently dispersed and subjected to light emission as its particle size is smaller. Thus, it has been hitherto considered that the use of a phosphor with a smaller particle size leads to a higher emission efficiency for a light-emitting device which emits light from such phosphor.

However, when studies have been made on the particle size and emission efficiency of such an oxide phosphor as mentioned above, it has been found that in such an oxide phosphor, a phosphor with a small particle size does not result in a high emission efficiency. The invention has been accomplished based on the finding that among the particles of a red light-emitting phosphor containing an Eu ion wherein the Eu ion directly absorbs light of a wavelength of 350 to 420 nm emitted from a semiconductor light-emitter and emits red light, those particles having an average size of secondary particles of 40 to 200 μm ensures high luminance light emission at a high emission efficiency to such an extent that the emission efficiency of the red light-emitting phosphor particles arrives at the same level as the emission efficiencies of a green light-emitting phosphor and a blue light-emitting phosphor used in combination therewith in a light-emitting device for emitting white light. In the light-emitting device for emitting white light using a red light-emitting phosphor, a green light-emitting phosphor and a blue light-emitting phosphor in combination, the use of the red light-emitting phosphor particles leads to a light-emitting device wherein fine color shades can be precisely reproduced and light is emitted at a high luminance.

Accordingly, a first embodiment of the invention is to provide a red light-emitting phosphor capable of emitting red light upon excitation with light having a wavelength of 350 to 420 nm, characterized by being represented by the following compositional formula (1)

$$A_{(1-x)}Eu_{(1-x-y)}Ln_yD_{2x}M_2O_8 \quad (1)$$

(wherein A is at least one element selected from the group consisting of Li, Na, K, Rb and Cs, Ln is at least one element selected from rare earth elements including Y but excluding Eu, D is at least one element selected from the group consisting of Mg, Ca, Sr and Ba, M is at least one element selected from Mo and W, x is a positive number satisfying 0<x≦0.7, y is 0 or a positive number satisfying 0<y≦0.5, and x+y is a number satisfying 0<x+y≦0.7).

In this case, the red light-emitting phosphor represented by the above compositional formula (1) should preferably be in the form of particles having an average size of secondary particles in range of 40 to 200 μm.

The red light-emitting phosphor represented by the compositional formula (1) is suited as a red light-emitting phosphor used in a light-emitting device wherein a semiconductor light-emitter for emitting light having a wavelength of 350 to 420 nm is sealed in a sealing member, and the red light-emitting phosphor is dispersed in the sealing member.

Moreover, the red light-emitting phosphor represented by the compositional formula (1) is suited as a red light-emitting phosphor used in a light-emitting device wherein the light-emitting device includes a phosphor layer containing the red light-emitting phosphor, and the phosphor layer is disposed in a path of light emitted from the semiconductor light-emitter.

A second embodiment of the invention is to provide a light-emitting device comprising a semiconductor light-emitter capable of emitting light having a wavelength of 350 to 420 nm, wherein the semiconductor light-emitter is sealed in a sealing member, red light-emitting phosphor particles are dispersed in the sealing member, the light-emitting phosphor contains an Eu ion that emits red light by direct absorption of light having a wavelength of 350 to 420 nm emitted from the semiconductor light-emitter, and an average size of secondary particles of the red light-emitting phosphor particles is in range of 40 to 200 μm.

In this case, the red light-emitting phosphor preferably includes the red light-emitting phosphor represented by the foregoing compositional formula (1) or a red light-emitting phosphor represented by the following compositional formula (2)

$$AEu_aSm_bZ_cM_2O_8 \quad (2)$$

(wherein A is at least one element selected from the group consisting of Li, Na, K, Rb and Cs, Z is at least one element selected from rare earth elements including Y and excluding Eu and Sm, M is at least one element selected from Mo and W, a is a positive number satisfying 0.8≦A≦1, b is 0 or a positive number satisfying 0<b≦0.2, c is 0 or a positive number satisfying 0<c≦0.2, and a+b+c=1).

Further, a third embodiment of the invention is to provide a light-emitting device comprising a semiconductor light-emitter capable of emitting light having a wavelength of 350 to 420 nm, wherein a phosphor layer is disposed in a path of light emitted from said semiconductor light-emitter, the phosphor layer contains red light-emitting particles, the light-emitting phosphor contains an Eu ion that emits red light by direct absorption of light having a wavelength of 350 to 420 nm emitted from the semiconductor light-emitter, and an average size of secondary particles of the red light-emitting phosphor particles is in range of 40 to 200 μm.

In this case, it is preferred that the semiconductor light-emitter is sealed in a sealing member. For the red light-emitting phosphor, the red light-emitting phosphor represented by the foregoing compositional formula (1) or the red light-emitting phosphor represented by the compositional formula (2) is preferred.

The red light-emitting phosphor of the invention exhibits a high emission intensity at a nonconventional, high light-emitting efficiency, particularly, in a wavelength of about 400 nm (e.g. 390 to 410 nm, especially 395 to 405 nm). Specifically, when this phosphor is applied to a light-emitting device emitting a white color or an intermediate color by use of a green light-emitting phosphor and a blue light-emitting phosphor in combination, there can be obtained a light-emitting device wherein minute color shades can be precisely reproduced and a white color or intermediate color is emitted at high luminance with good color rendering properties.

DESCRIPTION OF PREFERRED EMBODIMENTS

The invention is described in more detail.

Initially, a red light-emitting phosphor of the invention is described. The red light-emitting phosphor of the invention is one which emits red light upon excitation with light whose wavelength is at 350 to 420 nm. The red light-emitting phosphor is represented by the following compositional formula (1)

$$A_{(1-x)}Eu_{(1-x-y)}Ln_y D_{2x} M_2 O_8 \quad (1)$$

(wherein A is at least one element selected from the group consisting of Li, Na, K, Rb and Cs, Ln is at least one element selected from rare earth elements including Y but excluding Eu, D is at least one element selected from the group consisting of Mg, Ca, Sr and Ba, M is at least one element selected from Mo and W, x is a positive number satisfying $0<x\leq0.7$, y is 0 or a positive number satisfying $0<y\leq0.5$, and x+y is a number satisfying $0<x+y\leq0.7$).

In the compositional formula (1), A is at least one element selected from the group consisting of Li, Na, K, Rb and Cs, of which Li is preferred. Ln is at least one element selected from rare earth elements including Y and excluding Eu and specific examples of the rare earth element include Sm, La, Y, Gd, Lu and the like.

In the formula, D is at least one element selected from Mg, Ca, Sr and Ba, of which Ca is preferred. M is at least one element selected from Mo and W, of which W is preferred.

The ratios of individual elements constituting the red light-emitting phosphor of the invention are such that the element indicated by A is at (1-x), Eu is at (1-x-y), the element indicated by Ln is at y, the element indicated by D is at 2x and the element indicated by M is at 2, each relative to 8 oxygen atoms. In the above ratios, x is a positive number satisfying $0<x\leq0.7$ with a lower limit thereof being preferably $x\geq0.1$ and an upper limit being preferably $x\leq0.5$, more preferably $x\leq0.4$ and most preferably $x\leq0.3$. y is 0 or a positive number satisfying $0<y\leq0.5$, with a lower limit thereof being preferably $y\geq0.01$ and an upper limit being preferably $y\leq0.3$. In addition, x+y is a positive number satisfying $0<x+y\leq0.7$, with a lower limit thereof being $x+y\geq0.01$ and an upper limit being preferably $x+y\leq0.5$, more preferably $x+y\leq0.4$ and most preferably $x+y\leq0.3$.

The red light-emitting phosphor of the invention is as represented by the forgoing compositional formula (1) wherein the ratio (1-x) of the element indicated by A and the ratio of Eu indicated by (1-x-y) are both at not larger than 1. More particularly, the red light-emitting phosphor has such a structure that part of the ion site of the element indicated by A and the site of Eu ion ($Eu^{+3}$) is replaced by the ion of the element indicated by D. In this case, the ratio of Eu indicated by (1-x-y) is such that $0.3\leq(1-x-y)<1$, with its lower limit being preferably $(1-x-y)\geq0.5$, more preferably $(1-x-y)\geq0.6$ and most preferably $(1-x-y)\geq0.7$ and an upper limit being preferably $(1-x-y)\leq0.99$. If $(1-x-y)$ is smaller than 0.3, satisfactory red light emission by means of such excitation light having about 400 nm as mentioned above cannot be obtained.

The red light-emitting phosphor of the invention should contain Eu as an essential component, and a trivalent Eu ion absorbs light having a wavelength corresponding to an energy level such as, for example, of 382 nm, 395 nm and the like by means of the 4f electron. The red light-emitting phosphor of the invention is one which the $Eu^{3+}$ ion directly absorbs light to emit red light. The red light-emitting phosphor of the invention is not one which an energy such as of light emitted from a semiconductor light-emitter is once absorbed with a matrix crystal, a charge transfer condition where an electron is transferred from an anion adjacent to the $Eu^{3+}$ ion, a bandgap of the phosphor or the like. In this type of emission, the absorbed energy is transmitted to the $Eu^{3+}$ ion, and light is emitted from the $Eu^{3+}$ ion. More particularly, the $Eu^{3+}$ ion emits red light, not through excitation with the energy transmitted via absorption of an energy with such a matrix crystal, charge transfer condition or bandgap of the phosphor as set out above, but through direction excitation with an energy given from outside of the phosphor such as of light emitted from a semiconductor light-emitter.

The red light-emitting phosphor of the invention should have an average size of secondary particles of 40 to 200 μm, preferably 100 to 150 μm. The use of the particles within such a particle size as indicated above enables phosphor light emission of high intensity at a high emission efficiency. When the average particle size exceeds 200 μm, uniform dispersion of a phosphor may not be obtained in some case. If the average particle size is smaller than 40 μm, there is the possibility that a satisfactory emission efficiency and emission intensity may not be attained. It will be noted that the average particle size is expressed in terms of volume average size and is measured, for example, by a laser diffraction scattering method or the like.

In the practice of the invention, such red light-emitting phosphors are obtainable by firing, as starting materials, oxides, carbonates and the like containing elements constituting a red light-emitting phosphor, e.g. $Li_2CO_3$, $Na_2CO_3$, $Eu_2O_3$, $Sm_2O_3$, $WO_3$, $MoO_3$ and the like, formulating the starting materials at stoichiometric amounts sufficient to provide a given composition, mixing them such as in a ball mill and firing the resulting starting mixture, followed by washing with water, pulverizing and sieving, if necessary.

The firing procedure is not critical and a conventionally known method used for the manufacture of metal oxides used as phosphors may be applied as the procedure. For instance, there may be adopted a manufacturing method wherein such a starting mixture as mentioned above is placed in an alumina crucible and fired in a firing furnace such as an electric furnace. In this case, the firing temperature ranges 800 to 1300° C., preferably 800 to 1000° C. and more preferably 850 to 900° C., and the firing time ranges 30 minutes to 48 hours, preferably 2 to 12 hours.

In order to obtain red light-emitting phosphor particles whose size of secondary particles is large, a granulating agent such as water is conveniently added to red light-emitting phosphor particles having a small particle size, e.g. red light-emitting phosphor particles having an average size smaller than 40 μm, and granulated, and, if necessary, may be thermally treated, pulverized and classified.

The red light-emitting phosphor particle can be coated by $SiO_2$, $Al_2O_3$, liquid glass, or phosphate. The coated particle has a superior resistance in its own color change.

The light-emitting device of the invention is now described.

Initially, a first embodiment of a light-emitting device of the invention is described. The light-emitting device according to this first embodiment includes a semiconductor light-emitter capable of emitting light having a wavelength of 350 to 420 nm. The semiconductor light-emitter is sealed in a sealing member. Red light-emitting phosphor particles, particularly, those particles having an average size of secondary particles of 40 to 200 μm, preferably 100 to 150 pin, are dispersed in the sealing member.

Figure 1:
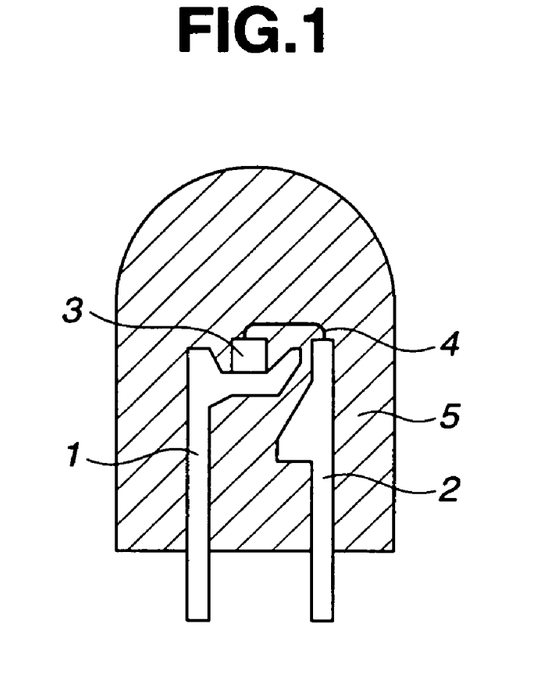
FIG. 1 is a view showing an example of an optical device of the invention and is more particularly a sectional view illustrating a light-emitting device wherein red light-emitting phosphor particles of the invention are dispersed in a sealing member of a light-emitting diode in the form of a bombshell.
Figure 2:
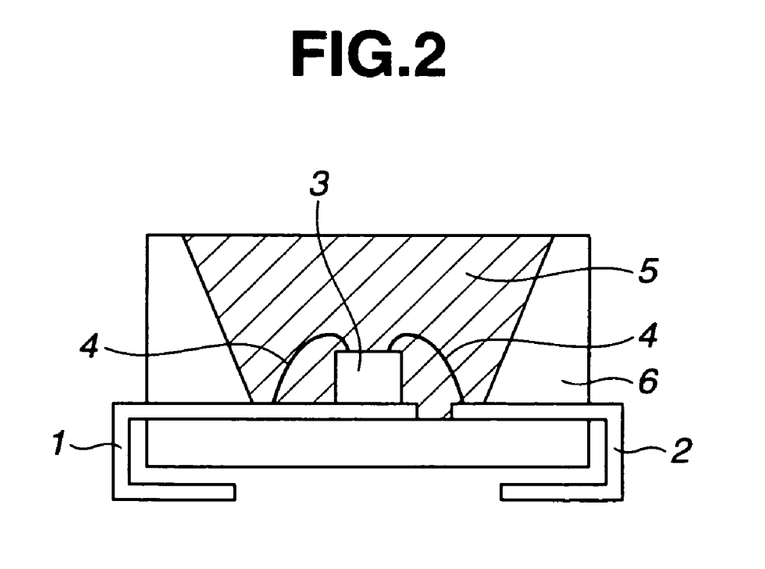
FIG. 2 is a view showing an example of an optical device of the invention and is more particularly a sectional view illustrating a light-emitting device wherein red light-emitting phosphor particles are dispersed in a sealing member of a light-emitting diode in the form of a chip.

More particularly, there is mentioned a so-called bombshell type of light-emitting diode having a structure which includes, as shown in FIG. 1, leads 1, 2, a semiconductor light-emitter 3 capable of emitting light having a wavelength of 350 to 420 nm, a lead fine wire 4 for electrically connecting the semiconductor light-emitter 3 and the lead 2 therewith, and a sealing member 5 for sealing in the form of a bombshell. Mention is also made of a so-called chip type of light-emitting diode having a structure which includes, as shown in FIG. 2, a pair of leads 1, 2 extending from an inner bottom of a box-shaped light-emitting body accommodating member, opened at the upper side thereof, to outside of the light-emitting body accommodating member 6, a semiconductor light-emitter 3 capable of emitting light having a wavelength of 350 to 420 nm and lead fine wires 4, 4, all of which are accommodated in the light-emitting body accommodating member 6, and a sealing member 5 for sealing therewith the inside components of the light-emitting body accommodating member 6 after connection thereof, a red light-emitting phosphor (particles) being dispersed in the sealing member 5.

The red light-emitting phosphor (particles) used in this light-emitting device contains an Eu ion, and the Eu ion directly absorbs light having a wavelength of 350 to 420 nm emitted from a semiconductor light-emitter. For such a red light-emitting phosphor, a red light-emitting phosphor represented by the foregoing compositional formula (1) is preferred. A red light-emitting phosphor which is represented by the following compositional formula (2)

$$AEu_aSm_bZ_cM_2O_8 \quad (2)$$

(wherein A is at least one element selected from the group consisting of Li, Na, K, Rb and Cs, Z is at least one element selected from rare earth elements including Y and excluding Eu and Sm, M is at least one element selected from Mo and W, a is a positive number satisfying 0.8: a≦1, b is 0 or a positive number satisfying 0<b≦0.2, c is 0 or a positive number satisfying 0<c≦0.2, and a+b+c=1) and which is in the form of particles having an average size of secondary particles of 40 to 200 μm, preferably 100 to 150 μm is also preferred.

In the particles of the red light-emitting phosphor represented by the compositional formula (2), an element indicated by A is at least one element selected from the group consisting of Li, Na, K, Rb and Cs, of which Li is preferred as A. Alternatively, it is also preferred to use, along with Li, at least one alkali metal selected from the group consisting of Na, K, Rb and Cs, preferably at least one alkali metal selected from the group consisting of Na and K, more preferably Na. Where A represents both Li and at least one alkali metal selected from the group consisting of Li, Na, K, Rb and Cs, a ratio of Li to A (p=Li/A) is preferably such that p≧0.4, more preferably p≦0.6, more preferably p≧0.7 and most preferably p≧0.8, and p<1, preferably p≦0.99, more preferably p≦0.95 ad most preferably p≦0.9.

The particles of the red light-emitting phosphor represented by the compositional formula (2) include those of the formula (2) wherein a satisfies 0.8≦a≦1 and thus, Eu and Sm and/or a rare earth element represented by Z are contained (i.e. 0.8≦a<1), and those which contain Eu alone (i.e. a=1).

In the compositional formula (2), the ratio of Eu (i.e. 'a') is a positive number satisfying 0.8≦a≦1, preferably 0.9≦a<1 (i.e. a ratio R of the Eu ion replaced by an ion of Sm and/or an rare earth element represented by Z is at 0≦R≦20 atomic %, preferably 0<R≦10 atomic %). If a is smaller than 0.8 (in case where the replacement ratio R exceeds 20%), satisfactory red light emission by excitation with light having about 400 nm in wavelength as set out hereinabove is not obtained.

With the phosphor particles containing both Eu and Sm and/or a rare earth element represented by Z, it is preferred that a in the compositional formula (2) is a positive number satisfying 0.95≦a<1, preferably 0.96≦a<1 and more preferably 0.96≦a≦0.98 (i.e. a ratio R of the Eu ion replaced by an ion of Sm and/or a rare earth element represented by Z is such that 0<R≦5 atomic %, preferably 0<R≦4 atomic % and more preferably 2≦R≦4 atomic %). Where a (replacement ratio R) is within the above range, the red light-emitting phosphor particles ensure red light emission of a high intensity by excitation with light of about 400 nm in wavelength and exhibit an emission intensity higher than conventional phosphors upon excitation with light within a range of 350 to 420 nm (i.e. upon excitation with light within a range wider than about 400 nm), thereby favorably providing red light-emitting phosphor particles that are very excellent as showing a high emission intensity within a wide range of excitation wavelength of 350 to 420 nm.

On the other hand, the ratio of Sm is such that b in the compositional formula (2) is a positive number satisfying $0<b\leqq0.2$ and the ratio of the rare earth element represented by Z is such that c in the compositional formula (2) is 0 or a positive number satisfying $0<c<0.2$, preferably $0<c<0.2$ and more preferably $0<c\leqq0.1$. It will be noted that the particles of the red light-emitting phosphor represented by the compositional formula (2) include, aside from those of a phosphor that contains as essential components both Eu and Sm and/or a rare earth element represented by Z (i.e. of a type wherein b is a positive number satisfying $0<b\leqq0.2$ and c is a positive number satisfying $0<c\leqq0.2$), those of a phosphor that contains Sm and does not contain the rare earth element represented by Z (i.e. of a type wherein b is a positive number satisfying $0<b\leqq0.2$ and $c=0$) and those of a phosphor that does not contain Sm but contains the rare earth element represented by Z (i.e. of a type wherein $b=0$ and c is a positive number satisfying $0<c\leqq0.2$).

The particles of the red light-emitting phosphor represented by the compositional formula (2) have an average size of secondary particles of 40 to 200 µm, preferably 100 to 150 µm. When using the particle size within the above-defined range, phosphor emission of high intensity can be attained at a high emission efficiency. When the average particle size exceeds 200 µm, uniform dispersion of the phosphor is not possible, whereas when the average particle size is smaller than 40 µm, a satisfactory emission efficiency and emission intensity is not ensured.

Such red light-emitting phosphor particles are obtainable by firing, as starting materials, oxides, carbonates and the like containing elements constituting red light-emitting phosphor particles, e.g. $Li_2CO_3$, $Na_2CO_3$, $Eu_2O_3$, $Sm_2O_3$, $WO_3$, $MoO_3$ and the like, formulating the starting materials at stoichiometric amounts sufficient to provide a given composition, mixing them such as in a ball mill and firing the resulting starting mixture, followed by washing with water, pulverizing and sieving, if necessary.

The firing procedure is not critical and a conventionally known method used for the manufacture of metal oxides used as phosphors may be applied as the procedure. For instance, there may be adopted a manufacturing method wherein such a starting mixture as mentioned above is placed in an alumina crucible and fired in a firing furnace such as an electric furnace. In this case, the firing temperature ranges 800 to 1300° C., preferably 800 to 1000° C. and more preferably 850 to 900° C., and the firing time ranges 30 minutes to 48 hours, preferably 2 to 12 hours.

In order to obtain red light-emitting phosphor particles whose size is large, a granulating agent such as water is conveniently added to red light-emitting phosphor particles having a small particle size, e.g. red light-emitting phosphor particles having an average size smaller than 40 µm, and granulated, and, if necessary, may be thermally treated, pulverized and classified.

The red light-emitting phosphor particle can be coated by $SiO_2$, $Al_2O_3$, liquid glass, or phosphate. The coated particle has a superior resistance in its own color change.

With the case of the light-emitting device of the first embodiment, the dispersion of such a red light-emitting phosphor (particles) alone in the sealing member 5 results in a light-emitting device emitting red light at high luminance. The dispersion along with a green light-emitting phosphor such as $BaMg_2Al_{16}O_{27}$:Eu, Mn, $Zn_2GeO_4$:Mn or the like, and a blue light-emitting phosphor such as $BaMg_2Al_{16}O_{27}$:Eu, (Sr, Ca, Ba)$_5$(PO$_4$)$_3$Cl:Eu or the like results in a light-emitting device emitting a white color or intermediate color of high luminance. In either of these light-emitting devices, it may be possible to add, as a red light-emitting phosphor, red light-emitting phosphors other than the phosphor represented by the foregoing compositional formula (1) or (2), e.g. $Y_2O_2S$:Eu, $La_2O_2S$:Eu, $3.5MgO.0.5MgF_2.GeO_2$:Mn or the like.

It will be noted that the light-emitting device of this first embodiment can be fabricated in such a way that when a semiconductor light-emitter and the like are sealed, a phosphor is mixed with a sealing material such as a resin, rubber, elastomer, glass or the like and used for the sealing. Especially, where a plurality of phosphors are used, there is the possibility that the red light-emitting phosphor of the invention has a true specific gravity higher than ordinary phosphors, and, when mixed with a sealing material, settles down more rapidly than other types of phosphors, thereby causing color shading to occur. To avoid this, it is preferred that the red light-emitting phosphor of the invention is dispersed in a sealing member by mixing with a highly viscous matter, e.g. a silicone rubber composition or silicone resin composition whose viscosity is controlled by a thixotropic agent and curing the mixture. For changing a color tone, pigments, dyes, and pseudo pigments may be added, aside from the phosphors mentioned hereinabove, to the sealing member.

Next, a second embodiment of a light-emitting device of the invention is descried. The light-emitting device according to the second embodiment includes a semiconductor light-emitter capable of emitting light having a wavelength of 350 to 420 nm. Preferably, the semiconductor light-emitter is sealed in a sealing member. The light-emitting device is includes a phosphor layer disposed in a path of light emitted from the semiconductor light-emitter. The layer contains a red light-emitting phosphor, particularly particles of a red light-emitting phosphor having an average size of secondary particles of 40 to 200 µm, preferably 100 to 150 µm.

Figure 3:
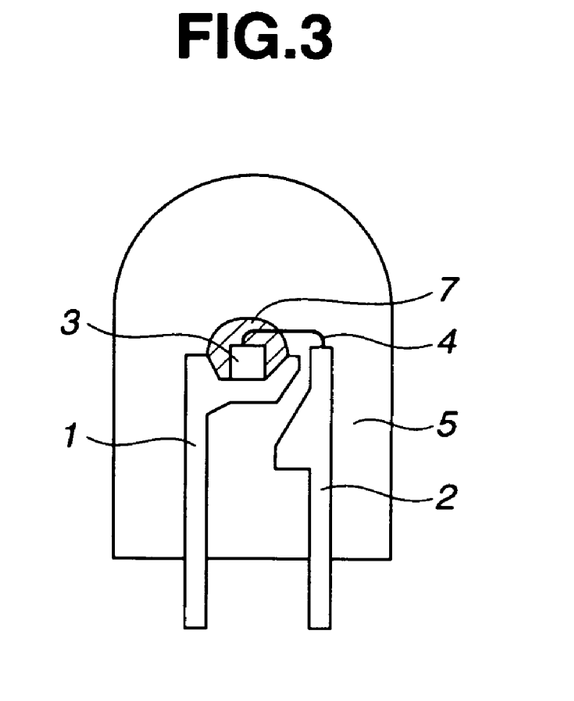
FIG. 3 is a view showing an example of an optical device of the invention and is more particularly a sectional view illustrating a light-emitting device wherein a phosphor layer containing red light-emitting phosphor particles of the invention is formed on a semiconductor light-emitter of a light-emitting diode in the form of a bombshell.
Figure 4:
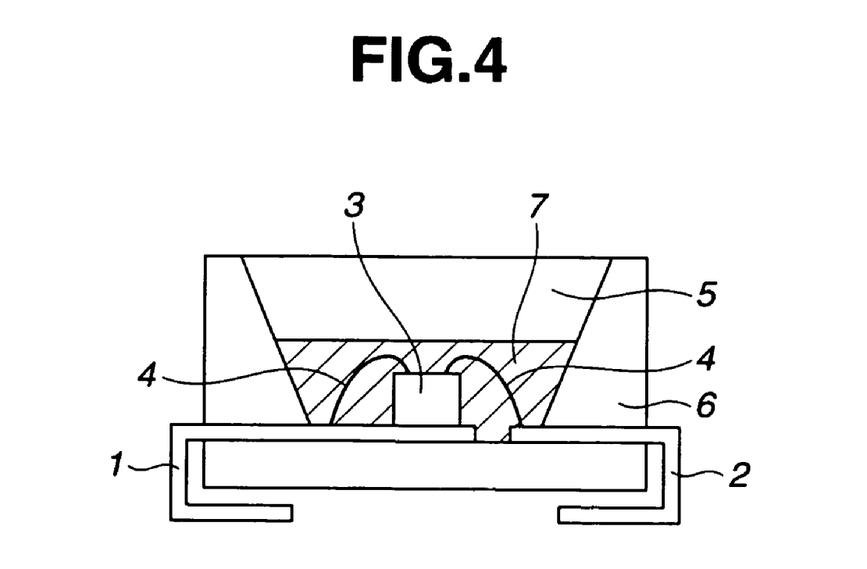
FIG. 4 is a view showing an example of an optical device of the invention and is more particularly a sectional view illustrating a light-emitting device wherein a phosphor layer containing red light-emitting phosphor particles of the invention is formed on a semiconductor light-emitter of a light-emitting diode in the form of a chip.
Figure 5:
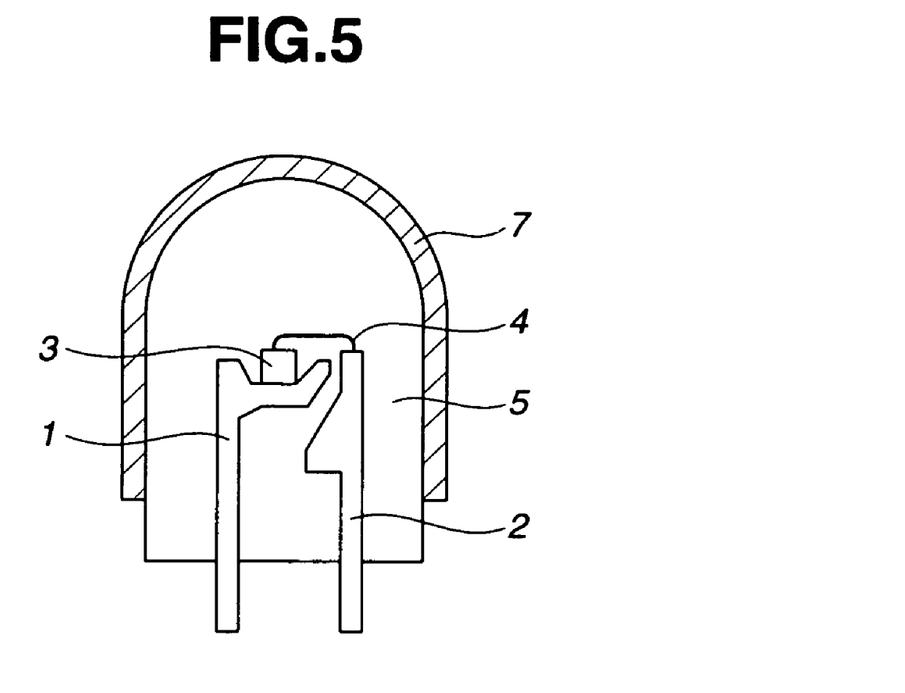
FIG. 5 is a view showing an example of an optical device of the invention and is more particularly a sectional view illustrating a light-emitting device wherein a phosphor layer containing red light-emitting phosphor particles of the invention is formed on a sealing member of a light-emitting diode in the form of a bombshell.
Figure 6:
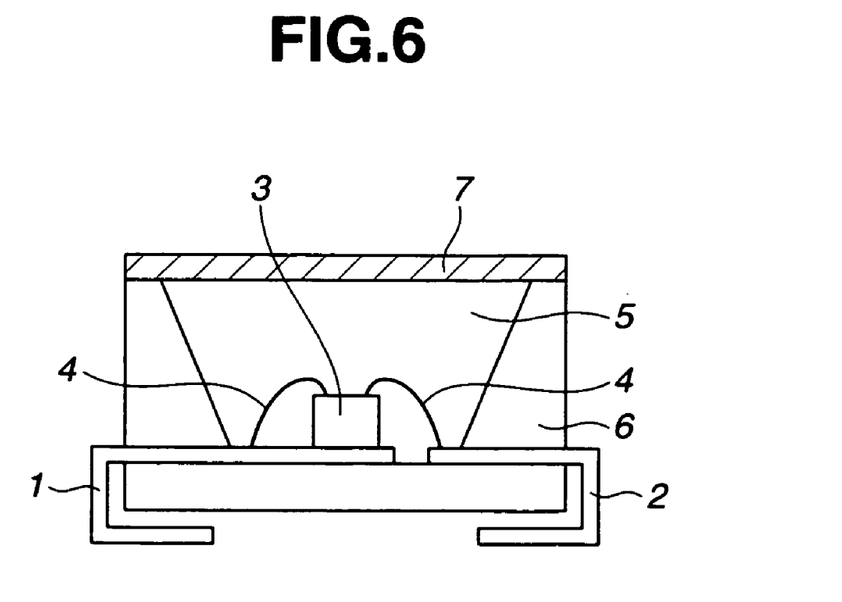
FIG. 6 is a view showing an optical device of the invention and is more particularly a sectional view illustrating a light-emitting device wherein a phosphor layer containing red light-emitting phosphor particles of the invention is formed on a sealing member of a light-emitting diode in the form of a chip.

Such a device includes, for example, one which a phosphor layer containing a red light-emitting phosphor (particles) is formed on a semiconductor light-emitter or a sealing member. More particularly, there is mentioned a so-called bombshell type of light-emitting diode having a structure which includes, as shown in FIG. 3, leads 1,2, a semiconductor light-emitter 3 capable of emitting light having a wavelength of 350 to 420 nm, and a lead fine wire 4 electrically connecting the semiconductor light-emitter 3 and the lead 2, all of which are sealed with a sealing member, a phosphor layer 7 being formed on the semiconductor light-emitter 3 of the light-emitting diode and sealed along with the semiconductor light-emitter 3 and the like Mention is also made of so-called chip type of light-emitting diode having a structure which includes, as shown in FIG. 4, a pair of leads 1, 2 extending from an inner bottom of a box-shaped, light-emitting body accommodating member 6, opened at an upper face thereof, to outside of the light-emitting body accommodating member 6, a semiconductor light-emitter 3 emitting light having a wavelength of 350 to 420 nm and lead fine wires 4, 4, both accommodated in the light-emitting body accommodating member 6 and connected with each other, the inner components of the light-emitting body accommodating member 6 being sealed with a sealing member 5, and a phosphor layer 7 being formed on the semiconductor light-emitter 3 of the light-emitting diode and sealed along with the semiconductor light-emitter 3 and the like. Moreover, a device (as shown in FIG. 5) including a phosphor layer 7 which is disposed on a sealing member 5 of a bombshell type of light-emitting diode so as to cover the sealing member 5, and a device (as shown in FIG. 6) including a phosphor layer 7 which is disposed on a sealing member 5 of a chip type of light-emitting diode are exemplified. It will be noted that the arrangements other than the phosphor layer in FIGS. 5 and 6 are the same as those shown in FIGS. 1 and 2, respectively, and are not illustrated again.

Figure 7:
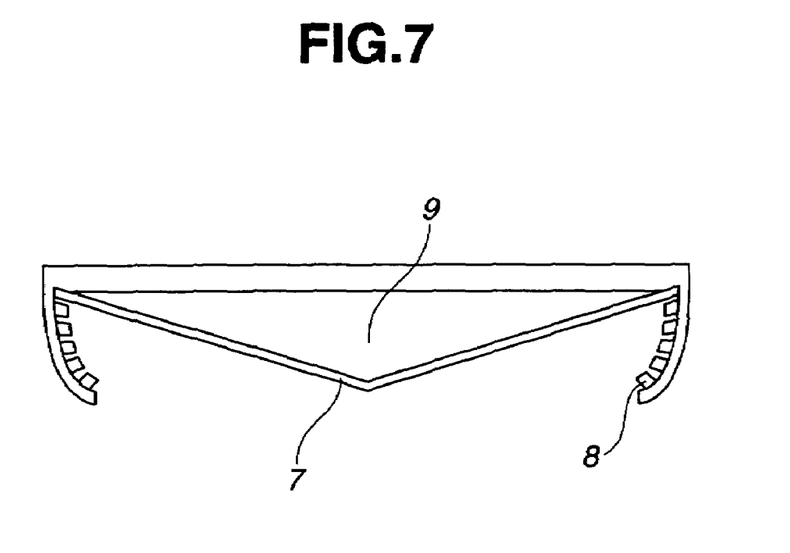
FIG. 7 is a view showing an optical device of the invention and is more particularly a sectional view illustrating a light-emitting device wherein a phosphor layer is formed apart from a light-emitting diode and light emitted from the phosphor layer is reflected.

Not only a so-called transmission type, as stated hereinabove, wherein the phosphor layer is disposed inside the light-emitting diode or adjacently to the light-emitting diode, but also a so-called reflection type of light-emitting device, as shown in FIG. 7, wherein a phosphor layer 7 is disposed away from light-emitting diodes 8 and light emitted from the phosphor layer is reflected at a reflector plate 9. Alternatively, with a light-emitting device wherein a phosphor layer is disposed on a sealing member as shown in FIGS. 5 and 6, the phosphor layer may be further sealed with a sealing member.

Still alternatively, those devices may be mentioned wherein a semiconductor light-emitter is sealed in a casing including a casing body made of a metal, a resin or the like, and a cover made of an optically transparent resin, glass or the like and shaped, for example, in the form of a lens.

The red light-emitting phosphor (particles) used in these light-emitting devices contains an Eu ion and emits red light by direct absorption, with the Eu ion, of light emitted from a semiconductor light-emitter with a wavelength of 350 to 420 nm. Such a red light-emitting phosphor favorably includes the afore-indicated red light-emitting phosphor represented by the compositional formula (1) or (2).

With the light-emitting device of the second embodiment, when the red light-emitting phosphor (particles) of the invention is dispersed in the phosphor layer, a light emitting device emitting a red color of high luminance is obtained. The dispersion along with a green light-emitting phosphor such as $BaMg_2Al_{16}O_{27}:Eu, Mn$, $Zn_2GeO_4:Mn$ or the like, and a blue light-emitting phosphor such as $BaMg_2Al_{16}O_{27}:Eu$, $(Sr, Ca, Ba)_5(PO_4)_3Cl:Eu$ or the like results in a light-emitting device emitting a white color or intermediate color of high luminance. In either of these light-emitting devices, it is possible to use, as a red light-emitting phosphor, red light-emitting phosphors other than the phosphor represented by the foregoing compositional formula (1) or (2), e.g. $Y_2O_2S:Eu$, $La_2O_2S:Eu$, $3.5MgO.0.5MgF_2.GeO_2:Mn$ or the like.

It will be noted that where a phosphor layer is formed on the semiconductor light-emitter, a phosphor may be used as it is or may be admixed with a binder. Alternatively, the phosphor layer may be provided as a molded product obtained by molding a phosphor alone or a mixture of a phosphor and a binder, if necessary. In this connection, for example, where the semiconductor light-emitter is sealed within a sealing member, the phosphor layer is sealed in the sealing member along with the semiconductor light-emitter as is particularly shown in FIGS. 3 and 4.

On the other hand, where the phosphor layer is formed on the sealing member, it is preferred to use a red light-emitting phosphor (particles) by dispersion in an optically transparent resin, rubber, elastomer or glass, preferably in a silicone resin or silicone rubber. Especially, where a plurality of phosphors are dispersed in a phosphor layer, it is preferred to disperse them in a phosphor layer by a procedure of mixing with a silicone tuber composition or silicone resin composition whose viscosity is controlled by a thixotropic agent and curing the mixture, like the case where a red light-emitting phosphor (particles) is dispersed in the sealing member as stated above. The phosphor layer may be a single layer made of a mixture of phosphors or may be a builtup layer wherein individual phosphors are separated into several layers. For changing a tone color, pigments, dyes, pseudo pigments and the like other than the phosphors may be added to the phosphor layer.

EXAMPLES

The invention is more particularly described by way of Examples, References and Comparative Examples, and should not be construed as limiting the invention to the following examples.

Examples 1 to 4, References 1 and 2

$Li_2CO_3$, $CaCO_3$, $Eu_2O_3$ and $WO_3$ provided as starting materials were weighed in amounts indicated in Table 1, respectively, and were uniformly mixed in a ball mill to provide starting mixtures.

Next, the thus obtained starting mixture was placed in an alumina crucible and fired at a temperature of 900° C. for 6 hours. The resulting fired product was ground into pieces in a mortar to obtain a powder of a red light-emitting phosphor.

Thereafter, light having a wavelength of 395 nm was extracted from a 150 W xenon lamp by use of a spectroscope and used as an excitation light source. The red light-emitting phosphor particles were made to be emitted in an integrating sphere having a diameter of 60 mm. The light emission was analyzed by use of a multiple instantaneous light measuring system MCPD-7000 (made by Ohtsuka Electronics Co., Ltd.).

The calculation methods of absorptivity, internal quantum efficiency and emission efficiency are described below. The excitation light source and a phosphor sample were alternately measured to measure the photon number (A) of the excitation light source, the photon number (B) of the excitation light source reflected from the phosphor sample, and the photon number (C) of light emitted from the phosphor sample. Using these photon numbers, calculation was made as follows.

Absorptivity of the phosphor sample=$(A-B)/A \times 100$

Internal quantum efficiency =$C/(A-B) \times 100$

Emission efficiency=absorptivity×internal quantum efficiency/100

The results are shown in Table 1.

TABLE 1

|  | Reference | Example | | | | Reference |
| --- | --- | --- | --- | --- | --- | --- |
|  | 1 | 1 | 2 | 3 | 4 | 2 |
| Composition | (1) | (2) | (3) | (4) | (5) | (6) |
| Amount $Li_2O_3$ [g] | 0.9236 | 0.8312 | 0.6465 | 0.4618 | 0.2771 | 0.0462 |
| $CaCO_3$ [g] | 0 | 0.5005 | 1.5014 | 2.5022 | 3.5032 | 4.7542 |

TABLE 1-continued

|  | Reference 1 | Example 1 | Example 2 | Example 3 | Example 4 | Reference 2 |
|---|---|---|---|---|---|---|
| $Eu_2O_3$ [g] | 4.3990 | 3.9591 | 3.0793 | 2.1995 | 1.3197 | 0.2200 |
| $WO_3$ [g] | 11.5920 | 11.5920 | 11.5920 | 11.5920 | 11.5920 | 11.5920 |
| Replacement ratio of Ca 2x [at. %] | 0 | 10 | 30 | 50 | 70 | 95 |
| Absorptivity [%] | 56.5 | 56.5 | 50.6 | 49.0 | 40.9 | 21.8 |
| Internal quantum efficiency [%] | 66.8 | 66.0 | 71.9 | 68.0 | 66.8 | 30.3 |
| Emission efficiency [%] | 37.7 | 37.2 | 36.4 | 33.4 | 27.3 | 6.6 |

Composition (1): $LiEuW_2O_8$
Composition (2): $Li_{0.9}Eu_{0.9}Ca_{0.2}W_2O_8$
Composition (3): $Li_{0.7}Eu_{0.7}Ca_{0.6}W_2O_8$
Composition (4): $Li_{0.5}Eu_{0.5}CaW_2O_8$
Composition (5): $Li_{0.3}Eu_{0.3}Ca_{1.4}W_2O_8$
Composition (6): $Li_{0.05}Eu_{0.05}Ca_{1.9}W_2O_8$ With these phosphors, the $Eu^{+3}$ ion directly absorbs excited light, so that if the concentration of $Eu^{+3}$ lowers, the absorptivity lowers. However, although the $Eu^{+3}$ ion concentration lowers as the replacement ratio of Ca increases from 0%, the internal quantum efficiency does not decrease. At a replacement ratio of Ca of not higher than 70%, the internal quantum efficiency is equal to or greater than that of the phosphor wherein the replacement ratio of Ca of 0%. In view of these results, it is considered that among the $Eu^{3+}$ ions in the phosphor, there exist some ions that do not take part in the light emission.

Examples 5 to 8

57.96 g of $WO_3$ powder, 15.40 g of $Eu_2O_3$ powder, 3.23 g of $Li_2O_3$ powder and 7.51 g of $CaCO_3$ powder were, respectively, weighed as starting materials for phosphor and uniformly mixed in a ball mill to obtain a starting mixture.

Next, the thus obtained starting mixture was placed in an alumina crucible and fired at a temperature of 900° C. for 6 hours. The resulting fired product was washed sufficiently with pure water to remove unnecessary soluble components therefrom, followed by more finely milling in a ball mill and sieving (mesh openings of 53 μm) to obtain powder of a red light-emitting phosphor having a composition of $Li_{0.7}Eu_{0.7}Ca_{0.6}W_2O_8$.

Next, water used as a granulating agent was added to the phosphor powder at a ratio of 1 to 3 wt %, followed by granulation. The granules were thermally treated at a temperature of 700 to 900° C. for 12 hours and sieved by use of sieves with mesh openings of 32 μm, 53 μm, 106 μm and 250 μm to obtain red light-emitting phosphor particles having different average particle sizes, respectively. It will be noted that the average particle size was measured by use of a laser diffraction size distribution measuring device SALD-2200 (made by Shimadzu Corporation). The average sizes of the resulting particles are shown in Table 2.

Thereafter, light having a wavelength of 395 nm was extracted from a 150 W xenon lamp by use of a spectroscope and was used as a excitation light source. The red light-emitting phosphor particles were made to be emitted in an integrating sphere having a diameter of 60 mm. The emitted light was analyzed with use of a multiple instantaneous light measuring system MCPD-7000 (made by Ohtsuka Electronics Co., Ltd.).

The absorptivity, internal quantum efficiency and emission efficiency were calculated in the same manner as in Example 1. The results are shown in Table 2.

TABLE 2

|  | Example 5 | Example 6 | Example 7 | Example 8 |
|---|---|---|---|---|
| Composition | \multicolumn{4}{c}{$Li_{0.7}Eu_{0.7}Ca_{0.6}W_2O_8$} |
| Average particle size [μm] | 18 | 42 | 97 | 209 |
| Absorptivity [%] | 47.9 | 56.8 | 64.0 | 72.1 |
| Internal quantum efficiency [%] | 74.0 | 75.8 | 75.1 | 74.8 |
| Emission efficiency [%] | 35.4 | 43.0 | 48.1 | 53.9 |

The above results show that as the diameter of secondary particles increases, the absorptivity is more improved and a higher emission efficiency is obtained.

Comparative Example 1, Examples 9 to 12

The red light-emitting phosphors obtained in Examples 5 to 8 and commercially available blue and green light-emitting phosphors were used in combination to compare characteristic properties in case where white light emission with a color temperature of 6,500 K was attained. The blue light-emitting phosphor used was $BaMgAl_{10}O_{17}:Eu^{2+}$ and the green light-emitting phosphor was ZnS:Cu, Al. For Comparative Example 1, a commercially available red light-emitting phosphor $La_2O_2S:Eu^{3+}$ was used to evaluate the resulting white light.

Figure 8:
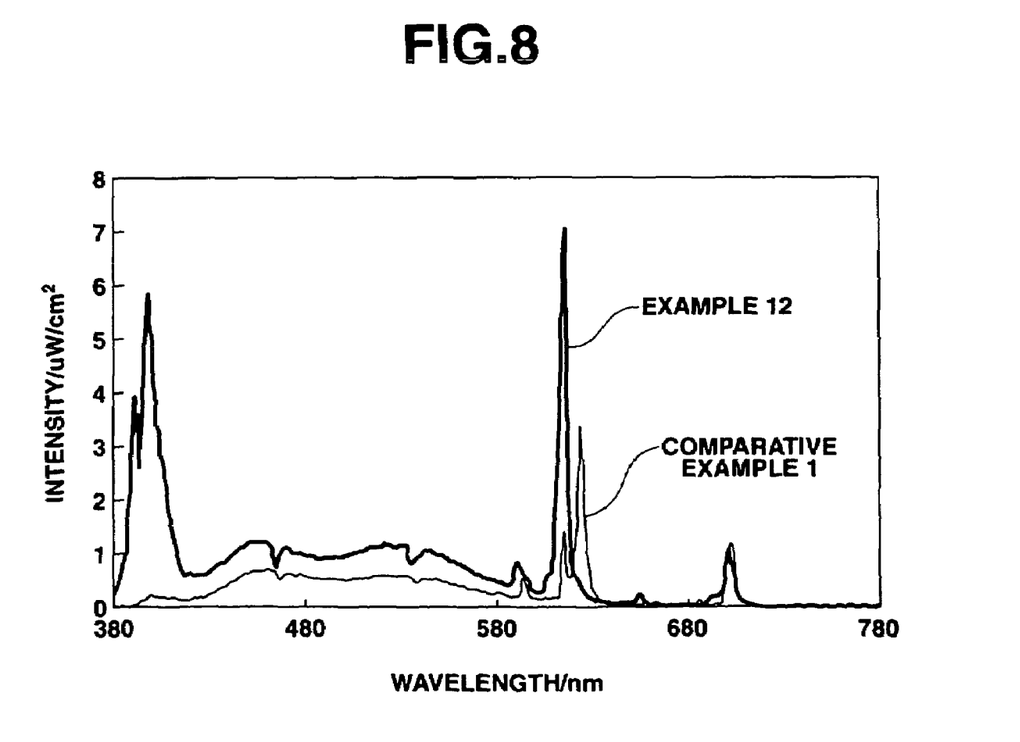
FIG. 8 is a diagram showing emission spectra of light-emitting devices of Comparative Example 1 and Example 12, respectively.

Red, green and blue light-emitting phosphors were formulated at ratios sufficient to ensure white light emission with a color temperature of 6,500 K and mixed with a silicone rubber and shaped into a 0.23 mm thick sheet by use of a hot press. This was cut into a disk with a diameter of 5 mm to provide a phosphor sheet. This phosphor sheet was placed in a light path of UV light emitted from a UV LED (L395-30T52, made by Epitex Inc.) having an emission peak of 396 nm placed in an integrating sphere. An impressed current was 20 mA. The emitted light was analyzed by use of a multiple instantaneous light measuring system MCPD-7000 (made by Ohtsuka electronics Co., Ltd.). The chromaticity, color temperature, relative luminance, general color rendering index (Ra) and special color rendering index (R9-R15) are indicated in Table 3. Emission spectra obtained in Comparative Example 1 and Example 12 are shown in FIG. 8.

TABLE 3

|  | Comparative Example 1 | Example 9 | Example 10 | Example 11 | Example 12 |
|---|---|---|---|---|---|
| Red light-emitting phosphor | $La_2O_2S:Eu^{3+}$ | $Li_{0.7}Eu_{0.7}Ca_{0.6}W_2O_8$ | | | |
| Average particle size [μm] | | 18 | 42 | 97 | 209 |
| Green light-emitting phosphor | | ZnS:Cu,Al | | | |
| Blue light-emitting phosphor | | $BaMgAl_{10}O_{17}:Eu^{2+}$ | | | |
| Ratios of phosphors [ratio by weight] Red:green:blue = | 100:27:40 | 100:3.8:3.2 | 100:3.9:3.1 | 100:3.7:3 | 100:3.6:3.1 |
| Chromaticity  x | 0.3132 | 0.3135 | 0.3114 | 0.3121 | 0.3128 |
| y | 0.3246 | 0.3219 | 0.3214 | 0.3253 | 0.3200 |
| Color temperature [K] | 6510 | 6516 | 6644 | 6570 | 6573 |
| Relative luminance [%] | 100 | 105 | 143 | 180 | 201 |
| General color rendering index Ra | 76.9 | 86.3 | 87.5 | 88.6 | 86.5 |
| Special color rendering index  R9 | −2.9 | 88.6 | 86.8 | 83.9 | 88.1 |
| R10 | 69.8 | 83.6 | 87.5 | 89.1 | 84.7 |
| R11 | 68.4 | 72.7 | 75.0 | 77.2 | 73.4 |
| R12 | 81.6 | 85.2 | 87.4 | 89.6 | 85.4 |
| R13 | 71.2 | 79.9 | 82.2 | 83.9 | 80.5 |
| R14 | 92.2 | 93.4 | 93.1 | 93.6 | 93.3 |
| R15 | 60.9 | 77.7 | 80.0 | 82.1 | 78.0 |

White light obtained in Examples 9 to 12 exhibits a luminance higher than that in Comparative Example 1. As an average size of the red light-emitting phosphor is large, the resulting white light has a improved luminance. The luminance of Example 12 is double that of Comparative Example 1. Moreover, using the red light-emitting phosphors of the invention, the general color rendering index (Ra) of white light is improved and thus, color rendering properties are better than those of the white light obtained in Comparative Example 1. As to the special color rendering indices, R9 indicating red color is remarkably improved from −2.9 to 80 or over. In view of this, it was found that with the light-emitting devices using the red light-emitting phosphors of the invention, white light of high luminance and good color rendition could be obtained.

Comparative Example 2, Examples 13 to 16

7.8112 g of $WO_3$ powder, 2.8456 g of $Eu_2O_3$ powder, 0.1175 g of $Sm_2O_3$ and 0.6224 g of $Li_2O_3$ powder were, respectively, weighed as starting materials for phosphor and uniformly mixed in a ball mill to obtain a starting mixture.

Next, the thus obtained starting mixture was placed in an alumina crucible and fired at a temperature of 900° C. for 6 hours. The resulting fired product was washed sufficiently with pure water to remove unnecessary soluble components therefrom, followed by more finely milling in a ball mill and sieving (mesh openings of 53 μm) to obtain powder of a red light-emitting phosphor having a composition of $LiEu_{0.96}Sm_{0.04}W_2O_8$.

Next, water used as a granulating agent was added to the phosphor powder at a ratio of 1 to 3 wt %, followed by granulation. The granules were thermally treated at a temperature of 700 to 900° C. for 12 hours and sieved by use of sieves with mesh openings of 32 μm, 53 μm, 106 μm, 150 μm and 250 μm to obtain red light-emitting phosphor particles having different average particle sizes, respectively. The average sizes of the resulting particles are shown in Table 4.

Thereafter, light having a wavelength of 395 nm was extracted from a 150 W xenon lamp by use of a spectroscope and was used as a excitation light source. The red light-emitting phosphor particles were made to be emitted in an integrating sphere having a diameter of 60 mm. The emitted light was analyzed with use of a multiple instantaneous light measuring system MCPD-7000 (made by Ohtsuka Electronics Co., Ltd.).

The excitation light source and a phosphor sample were alternately measured to calculate the photon number (A) of the excitation light source, the photon number (B) of the excitation light source reflected from the phosphor sample, and the photon number (C) of light emitted from the phosphor sample. Using these photon numbers, calculation was made on absorptivity of the phosphor sample ((A−B)/A×100), internal quantum efficiency (C/(A−B)×100) and emission efficiency (absorptivity×internal quantum efficiency/100).

The results are shown in Table 4.

TABLE 4

|  | Comparative Example 2 | Example 13 | Example 14 | Example 15 | Example 16 |
|---|---|---|---|---|---|
| Average particle size [μm] | 20 | 47 | 100 | 130 | 200 |
| Absorptivity [%] | 52.3 | 65.2 | 72.2 | 77.7 | 80.6 |
| Internal quantum efficiency [%] | 67.9 | 68.1 | 69.5 | 68.2 | 65.2 |
| Emission efficiency [%] | 35.5 | 44.4 | 50.2 | 53.0 | 52.6 |

Comparative Example 3, Examples 17 and 18

52.824 g of $(NH_4)_2HPO_4$ powder, 63.346 g of $Eu_2O_3$ powder, 4.004 g of $CaCO_3$ powder and 1.478 g of $Li_2O_3$ powder were, respectively, weighed as starting materials for phosphor and uniformly mixed in a ball mill to obtain a starting mixture.

Next, the thus obtained starting mixture was placed in an alumina crucible and fired at a temperature of 1300° C. for 6 hours. The resulting fired product was washed sufficiently with pure water to remove unnecessary soluble components therefrom, followed by more finely milling in a ball mill and sieving (mesh openings of 53 μm) to obtain powder of a Li—Ca—EuPO₄ red light-emitting phosphor having a main structure of EuPO₄ wherein part of the Eu site was replaced by Ca and Li.

Next, water used as a granulating agent was added to the phosphor powder at a ratio of 1 to 3 wt %, followed by granulation. The granules were thermally treated at a temperature of 1000 to 1300° C. for 12 hours and sieved by use of sieves with mesh openings of 32 μm, 53 μm and 106 μm to obtain red light-emitting phosphor particles having different average particle sizes, respectively. The average sizes of the resulting particles are shown in Table 5.

TABLE 5

|  | Comparative Example | Example | |
|---|---|---|---|
|  | 3 | 17 | 18 |
| Average particle size [μm] | 19 | 49 | 98 |
| Absorptivity [%] | 51.8 | 68.5 | 73.3 |
| Internal quantum efficiency [%] | 68.5 | 73.7 | 73.5 |
| Emission efficiency [%] | 35.5 | 50.5 | 53.9 |

For reference, light emitted from a commercially available green light-emitting phosphor and green light-emitting phosphor was analyzed in the same manner as in Examples 13 to 17 and Comparative Examples 2, 3 to calculate absorptivity, internal quantum efficiency and emission efficiency, with the results shown in Table 6.

TABLE 6

|  | Phosphor | | |
|---|---|---|---|
|  | Blue light-emitting phosphor | Green light-emitting phosphor | |
| Composition | BaMgAl₁₀O₁₇:Eu | BaMgAl₁₀O₁₇:Eu, Mn | ZnS:Cu, Al |
| Absorptivity [%] | 63.8 | 56.2 | 72.1 |
| Internal quantum efficiency [%] | 80.9 | 82.4 | 72.2 |
| Emission efficiency [%] | 51.6 | 46.3 | 52.1 |

From the comparison between Tables 4 and 6 and also between Tables 5 and 6, it is found that the red light-emitting phosphors whose average size of secondary particles ranges 40 to 200 μm have an emission efficiency which is in no way inferior to those of ordinarily employed blue light-emitting phosphor of BaMgAl₁₀O₁₇:Eu and green light-emitting phosphors of BaMgAl₁₀O₁₇:Eu, Mn and ZnS:Cu, Al. When this red light-emitting phosphor is used in combination with the green light-emitting phosphor and blue light-emitting phosphor, these phosphors can be formulated in a well-balanced fashion. Thus, there can be obtained a light-emitting device which ensures more precise reproduction of a minute color shade and emits white or intermediate color light at a high luminance.

Japanese Patent Application Nos. 2005-144087, 2005-290713 and 2006-179806 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A red light-emitting phosphor capable of emitting red light upon excitation with light having a wavelength of from 350 nm to 420 nm, wherein the red light-emitting phosphor is represented by the following compositional formula (1):

$$A_{(1-x)}Eu_{(1-x-y)}Ln_yD_{2x}M_2O_8 \qquad (1)$$

A is at least one element selected from the group consisting of Li, Na, K, Rb and Cs, Ln is at least one element selected from rare earth elements including Y but excluding Eu, D is at least one element selected from the group consisting of Mg, Ca, Sr and Ba, M is at least one element selected from Mo and W, x is a positive number satisfying $0.1 \leq x \leq 0.7$, y is 0 or a positive number satisfying $0 < y \leq 0.5$, and x+y is a number satisfying $0 < x+y \leq 0.7$.

2. A light-emitting device comprising a semiconductor light-emitter capable of emitting light having a wavelength of from 350 nm to 420 nm, wherein the semiconductor light-emitter is sealed in a sealing member, and the red light-emitting phosphor of claim 1 is dispersed in said sealing member.

3. A light-emitting device comprising a semiconductor light-emitter capable of emitting light having a wavelength of from 350 nm to 420 nm, wherein the semiconductor light-emitter is sealed in a sealing member, a phosphor layer is disposed in a path of light emitted from said semiconductor light-emitter, and the phosphor layer comprises the red light-emitting phosphor of claim 1.

* * * * *